United States Patent [19]

Yoshida et al.

[11] Patent Number: 5,027,117
[45] Date of Patent: Jun. 25, 1991

[54] CONVERSION USING A VARIABLE REFERENCE BASED ON IMAGE DENSITY

[75] Inventors: Yoshiki Yoshida; Kiyoto Nagasawa; Yoshinobu Kagami, all of Yokohama, Japan

[73] Assignee: Ricoh Company, Ltd., Tokyo, Japan

[21] Appl. No.: 328,454

[22] Filed: Mar. 24, 1989

[30] Foreign Application Priority Data

Mar. 31, 1988 [JP] Japan ................................. 63-78667

[51] Int. Cl.⁵ .................... H03M 1/34; H04N 1/40
[52] U.S. Cl. ................................ 341/132; 341/158; 341/159; 358/465
[58] Field of Search ............... 341/132, 139, 155, 156, 341/158, 159, 161, 162, 163; 358/461, 464, 465, 466

[56] References Cited

U.S. PATENT DOCUMENTS

| | | | |
|---|---|---|---|
| 4,367,457 | 1/1983 | Tadauchi et al. | 341/132 |
| 4,420,742 | 12/1983 | Tadauchi et al. | 341/132 |
| 4,496,987 | 1/1985 | Yuasa et al. | 341/158 |
| 4,571,573 | 2/1986 | Tadauchi et al. | 358/465 |
| 4,760,463 | 7/1988 | Nonoyama et al. | 358/465 |
| 4,853,792 | 8/1989 | Katsuta et al. | 358/464 |

FOREIGN PATENT DOCUMENTS

| | | | |
|---|---|---|---|
| 57-80871 | 5/1982 | Japan | 358/464 |
| 57-210774 | 12/1982 | Japan | 358/465 |
| 62-292020 | 12/1987 | Japan | 341/132 |
| 63-42225 | 2/1988 | Japan | 341/132 |

OTHER PUBLICATIONS

Dohanich et al., Gain Compensation System for Image Scanners, I.B.M. Technical Disclosure Bulletin, vol. 21, No. 1, Jun. 1978 p. 113.

Primary Examiner—William M. Shoop, Jr.
Assistant Examiner—H. L. Williams
Attorney, Agent, or Firm—Oblon, Spivak, McClelland, Maier & Neustadt

[57] ABSTRACT

An apparatus for converting an analog image signal to a digital image signal based on a reference voltage, includes a counter having a control terminal, for counting a first signal and outputting a counted value in digital form, a D/A converter for converting the counted value to an analog voltage signal served as the reference voltage, an A/D converter for converting the analog image signal to the digital image signal based on the reference voltage generated by the D/A converter, and a comparator for comparing in magnitude the digital image signal and a threshold level used for limiting the magnitude of the digital image signal, thereby outputting a control signal based on the results of comparison. The counter continues to count the first signal until the control signal derived from the comparator is supplied to the control terminal of the counter.

14 Claims, 7 Drawing Sheets

CONVERSION USING A VARIABLE REFERENCE BASED ON IMAGE DENSITY

BACKGROUND OF THE INVENTION

The present invention generally relates to an image scanner apparatus such as a facsimile machine and a digital copier, and more particularly to an image full-scale determination apparatus in which a reference voltage to be applied to an analog-to-digital converter which converts an analog image signal supplied from an image scanner to a digital image signal, is automatically generated.

A digital image scanner is typical of devices which employ an analog-to-digital converter (hereafter simply referred to as an A/D converter).

Figure 1:
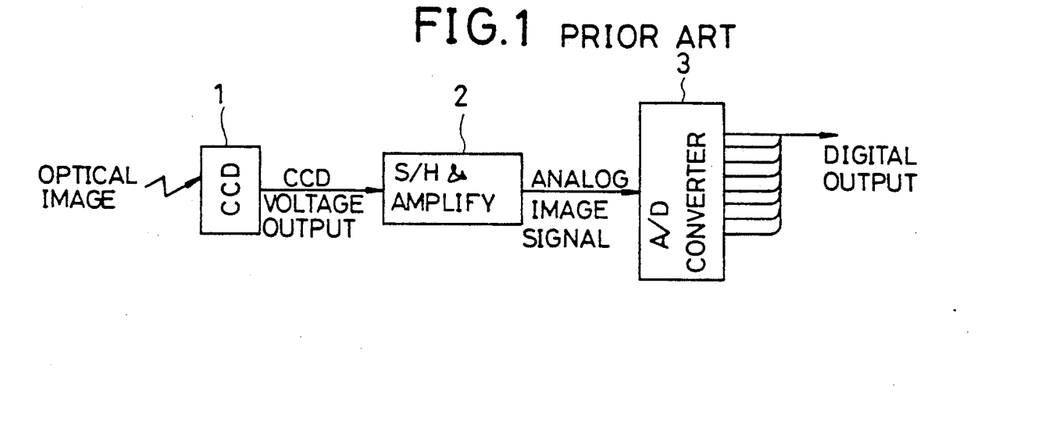
FIG.1 is a schematic view of a conventional image scanner.

FIG.1 illustrates an essential part of the structure of a digital image scanner. Referring to FIG.1, an optical image formed by light reflected onto a document surface is imaged onto a light receiving surface of an image sensor 1 such as a charge-coupled device, and is thereby converted to a corresponding electric analog image signal. Then, the analog image signal is subjected to an analog process implemented by a sample and hold/amplification circuit 2, and is then supplied to an A/D converter 3. The A/D converter 3 converts the analog image signal supplied from the sample and hold/amplification circuit 2 to a digital image signal.

Figure 2:
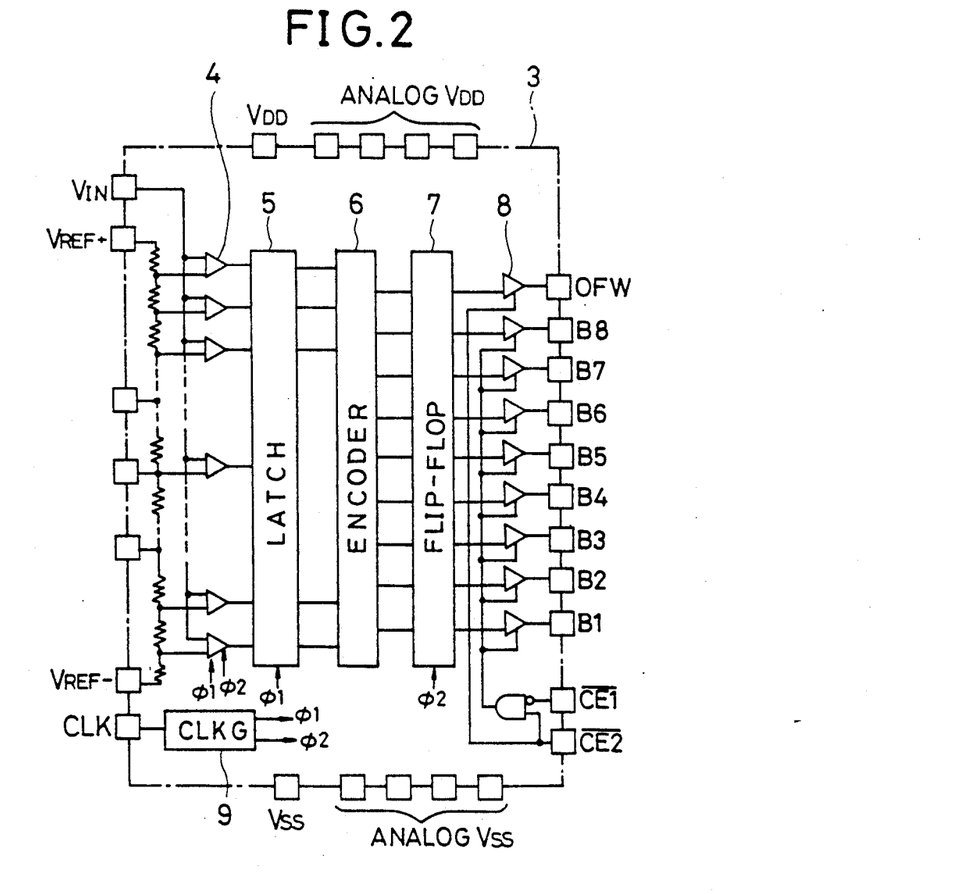
FIG.2 is a block diagram of an A/D converter used in FIG.1.

FIG.2 schematically shows an example of the structure for the A/D converter 3. The A/D converter 3 of FIG.2 has power source terminals $V_{DD}$, ground terminals $V_{SS}$, a single analog input terminal $V_{IN}$, a plurality of digital output terminals B1-B8 (8 bits, in this case), a clock terminal CLK to which a clock signal used for defining the operation timing of the A/D converter 3 is applied, an upper-limit setting terminal $V_{REF+}$, and a lower-limit setting terminal $V_{REF-}$. The upper-limit setting terminal $V_{REF+}$ is used for setting the upper limit $V_{REF+}$ of a reference voltage for the A/D conversion, and the lower-limit setting terminal $V_{REF-}$ is used for setting the lower limit $V_{REF-}$ of the reference voltage for the A/D conversion. Further, the illustrated A/D converter 3 is provided with an overflow terminal OFW for outputting an overflow. In the A/D converter 3, there are arranged a group of comparators 4, a latch circuit 5, an encoder 6, a flip-flop 7 and a group of tri-state buffers 8 in this order toward the output side from the input side. A clock generator 9 generates clock signals $\phi_1$ and $\phi_2$. The sum total of the digital outputs Bi is based on an analog input signal $V_{IN}$, the reference voltage upper-limit $V_{REF+}$ and the reference voltage lower-limit $V_{REF-}$. When the full scale of the digital output is represented as FS, the total sum of the digital outputs Bi is expressed as follows:

$$Bi = [(V_{IN} - V_{REF-})/(V_{REF+} - V_{REF-})] \cdot FS$$

When the digital output has a resolution corresponding to 8 bits (i=8), and the lower-limit setting terminal $V_{REF-}$ is set to ground potential, the above-indicated formula is rewritten as follows:

$$Bi = (V_{IN}/V_{REF+}) \cdot 255$$

It can be seen from the above formula that the total sum of the digital outputs Bi is based on the ratio of the input voltage to the reference voltage upper-limit $V_{REF+}$.

A problem arises in setting the reference voltage upper-limit $V_{REF+}$. When the reference voltage upper-limit $V_{REF+}$ is lower than the input voltage $V_{IN}$, the digital output is 255 of the full scale. On the other hand, when the reference voltage upper-limit $V_{REF+}$ is much higher than the input voltage $V_{IN}$, this is wasteful of gradation. Therefore, it is desired that the reference voltage upper-limit $V_{REF+}$ is set equal to a possible maximum level of the input voltage $V_{IN}$.

Figure 3:
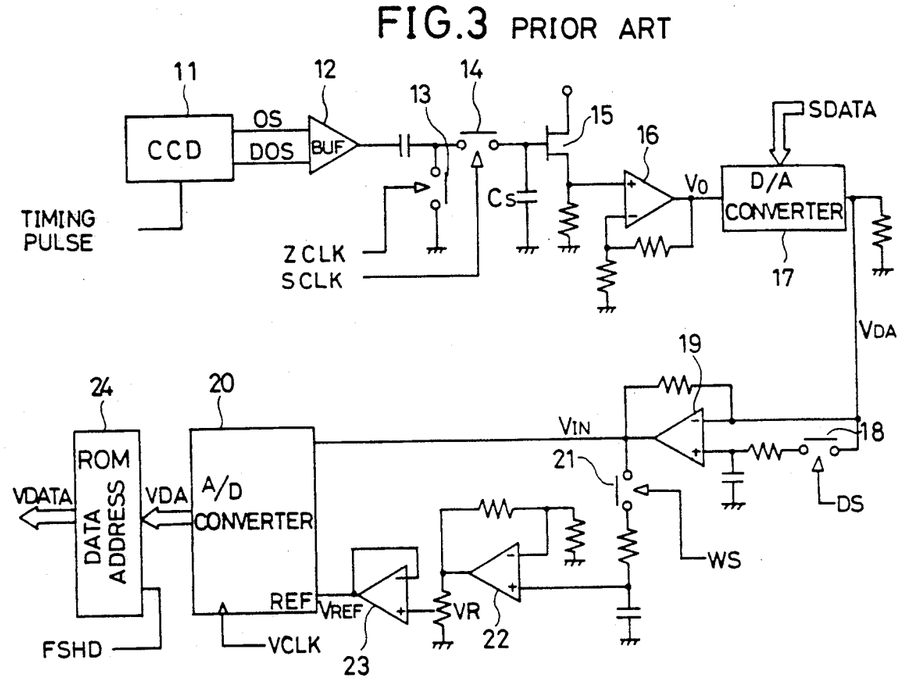
FIG.3 is an analog circuit diagram of a conventional image data processing circuit.

A description is given of a conventional configuration of an image data processing circuit including the sample and hold/amplification circuit 2 and A/D converter 3 shown in FIG.1, with reference to FIG.3. Referring to this figure, a charge-coupled device (hereafter simply referred to as a CCD) 11 is supplied with a timing pulse for data transfer and shifting. The CCD 11 generates an image signal OS and a dark signal DOS by self-scan of the CCD 11. The generated image signal OS and dark signal DOS are supplied to a buffer circuit 12, which amplifies the difference between the signals. Thereby, noise such as CCD reset noise is eliminated from the image signal OS. The output signal of the differential amplifier 12 is a pulse-like signal, and includes a direct current offset (hereafter simply referred to as a DC offset. The DC offset is removed as follows. First, a switch 13 is closed in response to a zero clock ZCLK, so that zero clamping is done. The zero clamping is carried out in order to determine zero level of the image signal output from the buffer circuit 12. Generally, the zero clamping is done by turning the switch 13 ON with a timing immediately after applying the reset pulse to the CCD 11. Secondly, a sample and hold operation is carried out by using a switch 14 and a capacitor Cs. That is, the switch 14 is turned ON to charge up the capacitor Cs only with a timing when the output of the CCD 11 correctly indicates image levels proportional to the rate of reflection on the document. The charge voltage across the capacitor Cs is applied to a buffer of a field effect transistor (hereafter simply referred to an FET) 15. Then, the FET 15 outputs, as a source output, an analog image signal which is generated based on a reference of zero volt.

The image signal output from the FET 15 is level-changed to a predetermined voltage Vo by an operational amplifier 16, and is then supplied to an reference voltage terminal REF of a digital-to-analog converter (hereafter simply referred to as a D/A converter) 17. On the other hand, a digital input terminal of the D/A converter 17 is supplied with shading correction data SDATA, which will be described later. An output signal $V_{DA}$ of the D/A converter 17 is proportional to a value obtained by multiplying the digital signal at the digital input terminal by the shading correction data SDATA, and is represented as follows:

$$V_{DA} \alpha Vo \times SDATA$$

The output signal $V_{DA}$ of the D/A converter 17 is supplied directly to an operational amplifier 19, and on the other hand, to the operational amplifier 19 through a switch 18. The operational amplifier 19 samples and holds a dummy signal DS, which is turned ON with a timing relating to a dummy pixel provided in the CCD 11. The above dummy pixel is a pixel which is located outside an effective pixel arrangement and which is held in a light interrupting state. Therefore, the dummy pixel always generates a dark signal component. Then, the operational amplifier 19 subtracts the dark signal component from the image signal $V_{DA}$. Thereby, the operational amplifier 19 generates a real analog image signal $V_{IN}$ in which the dark current component is already eliminated. The analog image signal $V_{IN}$ is an input image signal to be supplied to an A/D converter 20.

Figure 4:
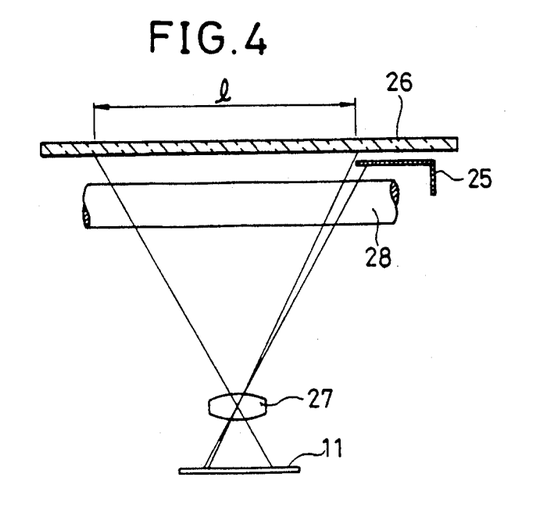
FIG.4 is a schematic side view of a conventional optical system.

On the other hand, a switch 21 is supplied with a white reference signal WS, which is generated with a timing when the CCD 11 scans a white reference plate 25 (FIG.4). During the time when the switch 21 is ON, two operational amplifiers 22 and 23 connected in series, are connected between the output of the operational amplifier 19 and the reference voltage terminal REF of the A/D converter 20. During the time when the CCD 11 scans the white reference plate 25, the analog image signal $V_{IN}$ output from the operational amplifier 19 is a white reference output. The white reference output is sampled and held with the timing of the white reference signal WS by which the switch 21 is turned ON. The sampled and held signal is then subjected to a level adjustment with the operational amplifier 22 and a variable resistor VR. A voltage signal of an adjusted level supplied from the variable resistor VR is a reference voltage $V_{REF}$ used for determining the full scale of the image signal.

FIG.4 also illustrates a contact glass 26, an image focusing lens 27, and a lamp 28 for exposure. A reference 1 indicates the effective image range.

An image clock VCLK is applied to the A/D converter 20, which converts the analog image signal $V_{IN}$ in synchronism with the image clock VCLK. In the A/D converter 20, the reference voltage $V_{REF}$ for A/D conversion is used as the reference (full scale). For example, when the analog image signal $V_{IN}$ consists of 8 bits, the output signal of the the A/D converter 20 is $(V_{IN}/V_{REF}) \cdot 255$. In this way, the analog image signal $V_{IN}$ is converted to a corresponding digital image signal by the A/D converter 20. Then, the digital image signal thus generated is subjected to a data conversion by a real only memory (hereafter simply referred to as a ROM) 14, which generates a corresponding digital video data VDATA in response to a timing signal FSHD.

However, the above-mentioned reference voltage determination process with the structure of FIG.3 has the following disadvantages. An analog circuit which is made up of the operational amplifiers 22, 23, and the variable resistor VR affects the stability of the system (circuit), even when the analog circuit is constructed by high-speed parts. Additionally, since the manual adjustment with the variable resistor VR is employed, variations in characteristics may occur over image data processing circuits. Further, the image angle of the CCD 11 is extended over the effective image range. Therefore, a decreased number of pixels is permitted to be arranged in the effective image range, and therefore the effective scan rate of the CCD 11 is decreased.

A further description is given of the above-indicated disadvantages. In analog configurations, noise is one of the reasons which cause the system to be unstable. For example, when noise, particularly pulse like noise having a fixed period, is introduced into a power source, the noise suppression effect of amplifiers is extremely deteriorated. As a result, noise is also introduced into the data VDATA of the system. The reference voltage for the A/D converter 20 which is generated under the above-mentioned unstable condition, is not reliable. Further, a fluctuation of signal level may occur due to temperature variation. Therefore, time deterioration in image quality may occur for long use. On the other hand, the level variation may occur even in the variable resistor VR, with which the manual adjustment is done. Therefore, variations in characteristics over circuits are great.

Shading correction is further described. Generally, shading correction is employed for image scanners for optically reading documents. This results from illuminance distribution characteristics of a light source, focusing characteristics of lenses, and sensitivity fluctuation over pixels of CCDs. The illuminance distribution characteristics exhibit that an illuminance obtained at the center of the light source is larger than that obtained at both the sides thereof. The focusing characteristics exhibit that light is converged to a center portion of a lens. This is so-called cosine-power-of-4-rule. Generally, the maximum sensitivity variation is ± 10%.

Figure 5A:
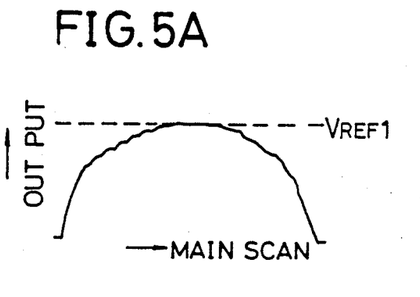
FIGS.5A and 5B are views showing digital output characteristics.
Figure 5B:
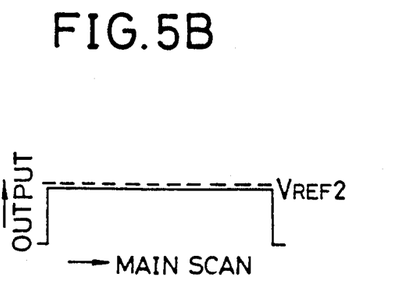

FIG.5A illustrates a waveform of a signal which is obtained by reading an image of uniform white and amounts to one line in a main scanning direction. As is illustrated, signal levels at a center portion of the line are higher than those in other portions, and fluctuate with a short period (pixel period). When the signal of FIG.5A is subjected to the shading correction, the resultant signal waveform of FIG.5B is obtained. As is illustrated in FIG.5B, the resultant signal waveform is almost uniform over the line. In FIGS.5A and 5B, broken lines represent the corresponding reference voltage upper-level $V_{REF+}$.

Figure 6A:
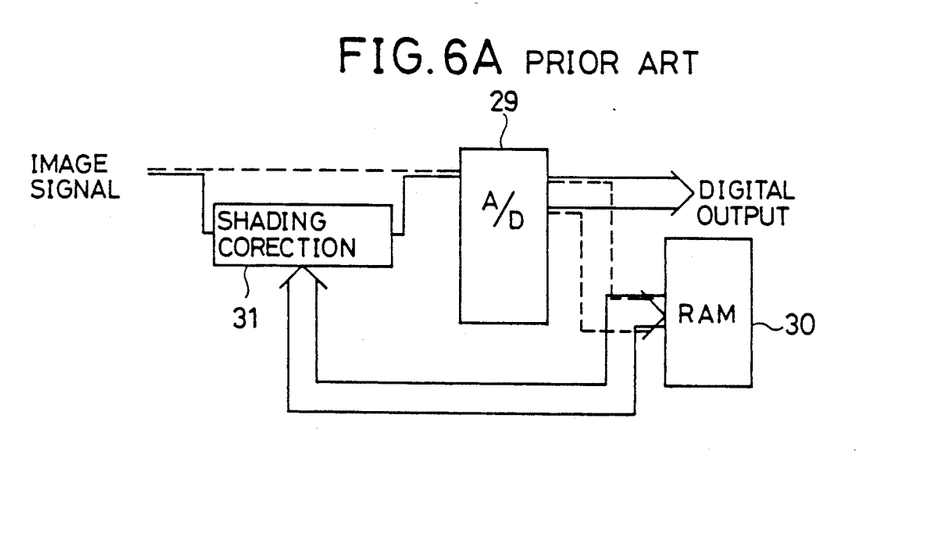
FIG.6A is a block diagram illustrating operation to be done when the shading correction is carried out, and operation to be done at the time of normal reading.

A variety of shading correction has been proposed. One of the effective proposals is described below. A white reference plate is placed in an image effective range 1 of the CCD 11. The above white reference plate is different from the white reference plate 25 shown in FIG.4. Before the normal image reading, the white reference plate is scanned, and thereby a signal waveform as shown in FIG.5A is obtained. Next, as shown in FIG.6A, the A/D conversion is carried out by an A/D converter 29 (of the same structure as the A/D converter 3) through a path indicated by broken lines. The obtained digital image data is stored in a random access memory (hereafter simply referred to as a RAM) 30. Then, during normal reading operation, the digital image data is derived from the A/D converter 20 through a path including a shading correction circuit 31 indicated with solid lines. The shading correction circuit 31 includes a digital-to-analog multiplier and a ROM. Variations in sensitivity can be corrected by dividing the image signal applied to the shading correction circuit 31 by the digitized white signal stored in the RAM 30.

Anyhow, it is necessary to use two different reference voltages $V_{REF1}$ and $V_{REF2}$ (FIGS.6A and 6B) for the A/D conversion performed at the time of shading correction and normal image reading. Conventionally, two reference voltages $V_{REF1}$ and $V_{REF2}$ are generated with a circuit shown in FIG.6B. Referring to this figure, two analog switches 32 and 33 are used. The analog switch 32 is turned ON only during the shading correction, and on the other hand, the analog switch 33 is turned ON during the normal reading operation. When the shading correction data is generated by reading the white reference plate, the reference voltage $V_{REF1}$ to be supplied to a terminal $V_{REF+}$ of an A/D converter is adjusted by tuning the variable resistor VR1 so as to become equal to the maximum value of the analog image signal $V_{IN}$ while observing the output waveform on an oscilloscope. In the normal reading operation, the reference voltage $V_{REF2}$ to be supplied to the terminal $V_{REF+}$ of the A/D converter 29 is adjusted by tuning the variable resistor VR2 so as to become equal to the maximum value of the analog image signal $V_{IN}$.

Figure 6B:
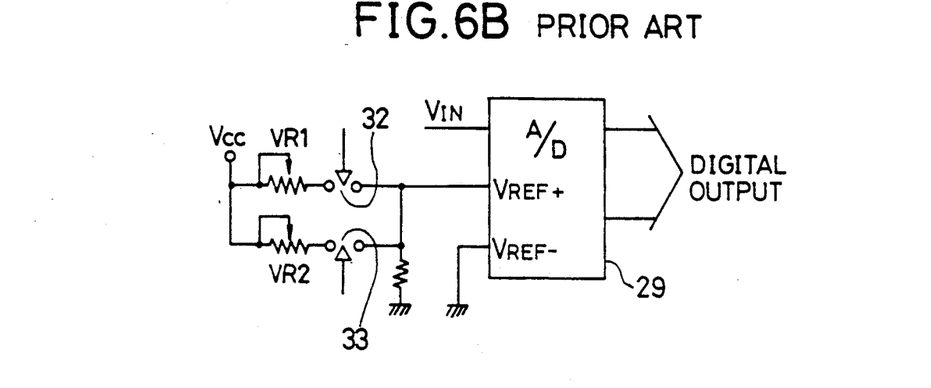
FIG.6B is a peripheral circuit of an A/D converter shown in FIG.6A.

However, the above adjustment has the following disadvantages. First, it is necessary to manually adjust the variable resistors VR1 and VR2, which is troublesome and needs long time. Additionally, since the adjustment is manually done while observing the oscilloscope, it is impossible to set the reference voltages to the maximum level of the input image signal $V_{IN}$ with high precision. Moreover, an amount of light emitted by the light source is fluctuated due to variations in the power source voltage, rise response characteristics exhibited when turning ON the power source, and time deterioration of the light source. For these reasons, the level of the analog image signal $V_{IN}$ varies. Once the adjustment is completed, an error may occur in a few minutes.

SUMMARY OF THE INVENTION

It is therefore a general object of the present invention to provide a novel and useful image full-scale determination apparatus in which the above-mentioned disadvantages are eliminated.

A more specific object of the present invention is to provide an image full-scale determination apparatus capable of automatically setting the reference voltages for A/D conversion with a reduced time and high precision. Thereby, gradation levels can be effectively used. Further, the apparatus becomes immune to noise.

The above objects of the present invention can be achieved by an apparatus for converting an analog image signal to a digital image signal based on a reference voltage, comprising:

counter means having a control terminal, for counting a first signal and outputting a counted value in digital form;

digital-to-analog (D/A) converting means, connected to the counter means, for converting the counted value to an analog voltage signal served as the reference voltage;

analog-to-digital (A/D) converting means, connected to the D/A converter means, for converting the analog image signal to the digital image signal based on the reference voltage generated by the D/A converting means; and comparing means, connected to the A/D converter means, for comparing in magnitude the digital image signal and a threshold level used for limiting the magnitude of the digital image signal, thereby outputting a control signal based on the results of comparison, the counter means continuing to count the first signal until the control signal derived from the comparing means is supplied to the control terminal of the counter means.

Other objects, features and advantages of the present invention will become apparent from the following detailed description when read in conjunction with the accompanying drawings.

DESCRIPTION OF THE PREFERRED EMBODIMENTS

A description is given of a first preferred embodiment of the present invention. The first embodiment of the present invention utilizes a signal process identical to the signal process done between the CCD 11 and the operational amplifier 19 of FIG.3. An essential feature exists in a circuit which follows the operational amplifier 19.

Figure 7:
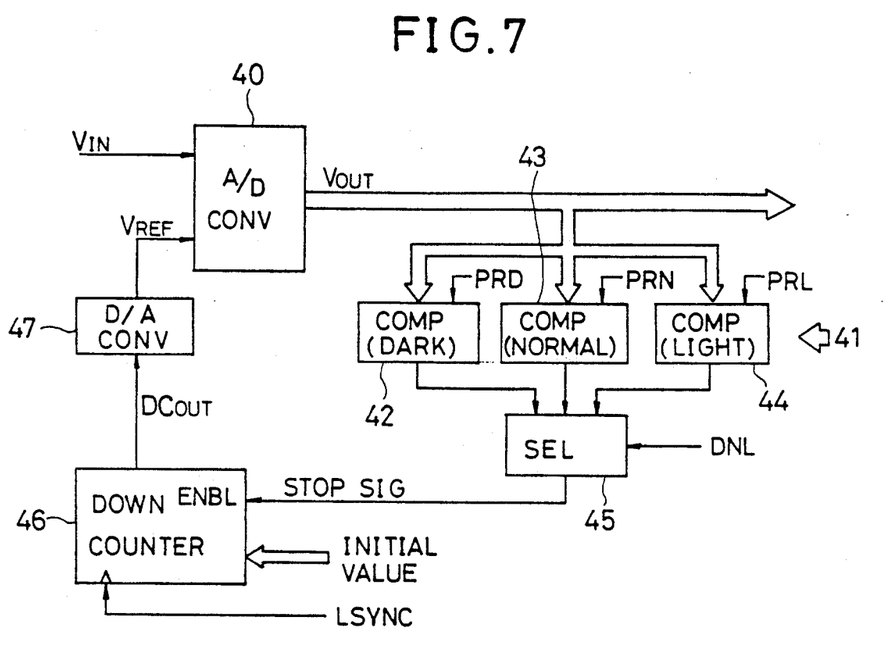
FIG.7 is a block diagram of a first preferred embodiment of the present invention.

Referring to FIG.7, the first embodiment of the present invention includes an A/D converter 40, to which the analog image signal $V_{IN}$ available at the output terminal of the operational amplifier 19 is applied. As will be described in detail later, the A/D converter 40 converts the analog image signal $V_{IN}$ to digital output data Vout based on with a reference voltage $V_{REF}$ used as a full scale thereof. When the resolution amounts to 8 bits, the digital output data Vout is represented as $$Vout = (V_{IN}/V_{REF}) \cdot 255$$

In the above formula, it is assumed that the reference voltage corresponds to the aforementioned reference voltage upper-limit $V_{REF+}$, and $V_{REF-} = 0$. The output data Vout derived from the A/D converter 40 is supplied to a shading correction data storing part (not shown), and also to a group of comparators 41. The group of comparators 41 includes comparators 42, 4 and 44 used for setting three different gradation levels. The comparator 42 is used for processing a dark current. The comparator 43 relates to normal operation. The comparator 44 relates to the process of the white reference plate. Output data limiting values PRD, PRN and PRL are preset in the comparators 42, 43 and 44, respectively. The comparators 42-44 can operate at the same time. Output signals of the comparators 42-44 are supplied to a selector 45, which selects one of them, depending on a density selection signal DNL which represents density selecting operation made outside the illustrated circuit. The selector 45 is served as a controller with respect to a down counter 46. The output terminal of the selector 45 is connected to an enable terminal ENBL of the down counter 46. The selected one of the output signals of the comparators 42-44 is served as a count stop signal.

A counter initial value is preset in the down counter 46, which starts counting down, for every line, pulses of a line synchronizing signal LSYNC from the counter initial value. The line synchronizing signal LSYNC is generated by an external circuit (not shown). When the count stop signal output supplied through the selector 45 is applied to the enable terminal ENBL of the down counter 46, the down counter 46 stops counting. A counted value output DCout supplied from the down counter 46 is supplied to a D/A converter 47, which generates an analog voltage signal indicative of the counted value DCout in digital form. The analog voltage is the reference voltage $V_{REF}$ to be supplied to the A/D converter 40 to be supplied to the terminal $V_{REF+}$ of the A/D converter 40 used for setting the upper-limit. That is, as the center of the A/D converter 40, there is formed a logical feed-back loop made up of the group of comparators 41, the selector 45, the down counter 46 and the D/A converter 47. With the logical feed-back loop, the full scale (reference voltage $V_{REF}$ is determined by a digital process described below.

Figure 9:
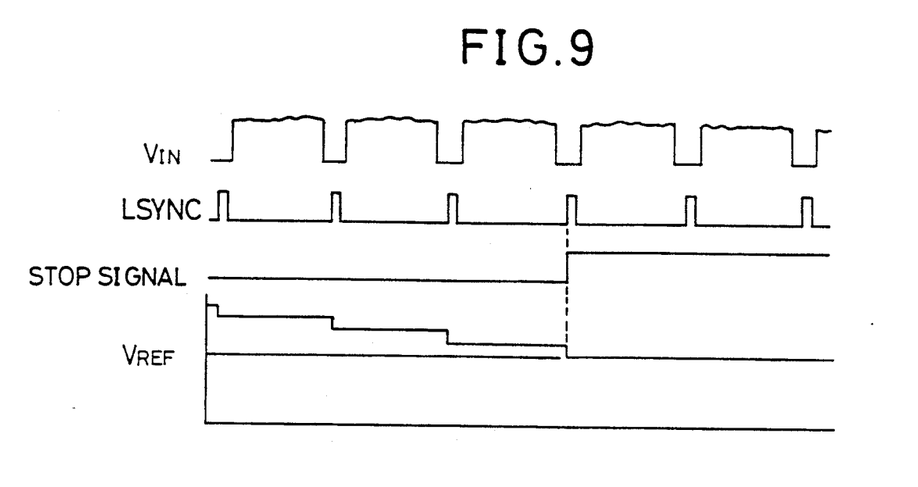
FIG.9 is a view illustrating waveforms of signals at different parts of the structure of FIG.7.

The operation commences reading the white reference plate 25 as shown in FIG.4. At this time, the line synchronizing signal LSYNC is supplied to the down counter 46, which takes the counter initial value therein as the preset value. Then, the down counter 46 counts down the line synchronizing signal for every line. Therefore, the reference voltage decreases for every line, as shown in FIG.9. Then the output data DCout of the down counter 46 is converted to the analog reference voltage $V_{REF}$ by the D/A converter 47. Thereby, the reference voltage $V_{REF}$ is supplied to the A/D converter 40. The A/D converter 40 converts the analog image data $V_{IN}$ relating to the white reference plate to the digital output data Vout on the basis of the reference voltage $V_{REF}$ generated in the above-mentioned way.

It is now assumed that the comparison result of the the comparator 44 is used for setting the reference voltage $V_{REF}$. The selector 45 passes only the comparison result of the comparator 44 by the density selection signal DNL.

Figure 8:
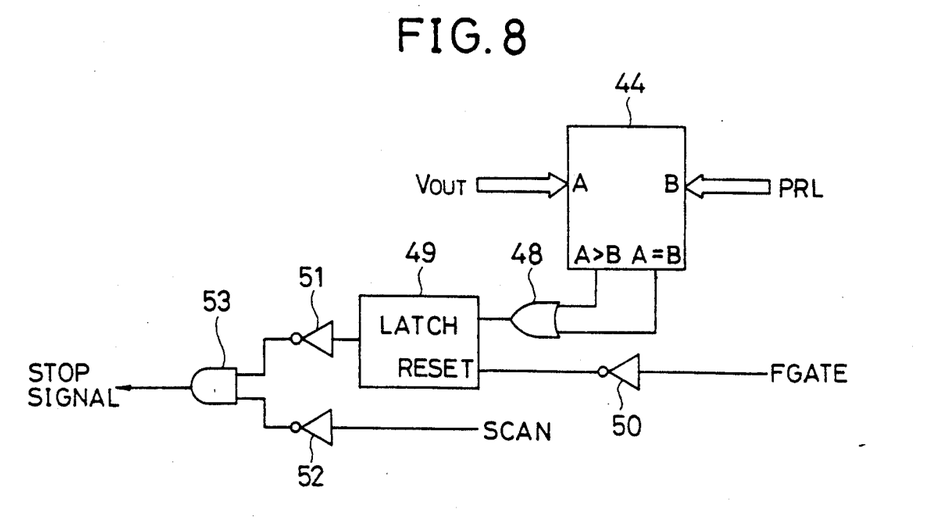
FIG.8 is a circuit diagram of a part of the structure of FIG.6.
Figure 11:
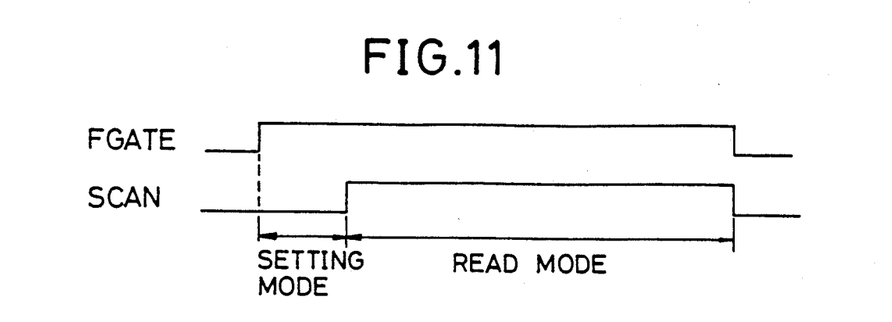
FIG.11 is a view illustrating the waveforms of signals at different parts of the structure of FIG.7.

FIG.8 illustrates the comparator 44 and its peripheral circuit. An input terminal A of the comparator 44 is supplied with the output data Vout derived from the A/D converter 40, and an input terminal B is supplied with the output data limiting value PRL. The comparator 44 compares in magnitude the output data Vout and the output data limiting value PRL. When A=B, or A>B, that is, the output data Vout is equal to or larger than the output data limiting value PRL, a signal is supplied to a latch circuit 49 from the comparator 44 through an OR gate 48. The latch circuit 49 is controlled by a frame signal FGATE indicative of a duration between the beginning and end of reading a sheet of document. The frame signal FGATE, which is generated by an external circuit, is supplied to a reset terminal of the latch circuit 49 through an inverter 50. Thereby, the latch circuit 49 is reset for every sheet of document. Then an output signal of the latch circuit 49 is supplied to the selector 45 through an inverter 51 and an AND gate 53 and then supplied to the enable terminal ENBL of the down counter 46. That is, when the data output Vout becomes equal to the output data limiting value to be set in the comparator 44, the down counter 46 stops counting, and therefore, a counted value DCout latched at that time is supplied to the D/A converter 47. Then, the latched count value DCout is converted to the corresponding analog signal, which is served as the reference voltage $V_{REF}$ with respect to the A/D converter 40. A scanning signal SCAN, and inverters 51, 52, and AND gate 53 are used in order that the above-mentioned reference voltage setting operation is made inactive in the normal reading operation even during the time when the frame signal FGATE is output. This is illustrated in FIG.11.

Figure 12:
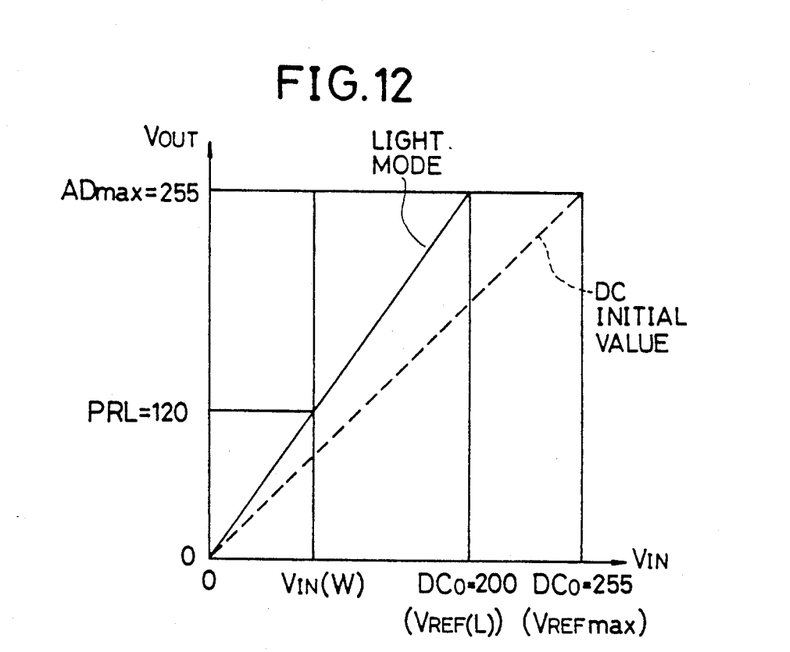
FIG.12 is a graph for explaining a light mode.

FIG.12 illustrates relationship between the input and output of the A/D converter 40 as parameters of three reference voltages $V_{REF}(D)$, $V_{REF}(N)$, and $V_{REF}(L)$, which indicate the reference voltages (values of the full scale of the image signal) to be set in dark, normal and light modes, respectively. $V_{IN}(W)$ is an input voltage to be supplied to the A/D converter 40 obtained at the time of reading the white reference plate.

A further description is given of the operation of the first embodiment. Since operation is almost the same in each of the dark, normal and light modes. Therefore, an operation in the light mode is described below. When reading the white reference plate, the A/D converter 40 is supplied with the image data signal $V_{IN}$ which has been subjected to the shading correction as shown in FIG.5B. In response to the start of reading, the down counter 46 sequentially counts down from the counter initial value preset therein. At the commencement of down count, the comparator 44 is kept at L (low) level, because A<B. Therefore, at this time, the latch circuit 49 latches no signal. As a result, the enable terminal ENBL of the down counter 46 is kept at H level, so that the down counter 46 continues to count down. Thereafter, when the output data Vout becomes equal to or larger than the output data limiting value PRL for the comparator 44, even if the above output data Vout amounts to one pixel, the output of the comparator 44 is switched to H level. This is latched by the latch circuit 49, and therefore the enable terminal ENBL of the down counter 46 is switched to L level. This means that the count stop signal is applied to the enable terminal of the down counter 46. Thereby, the down counter 46 stops counting, and keeps a value counted at that time.

Figure 10:
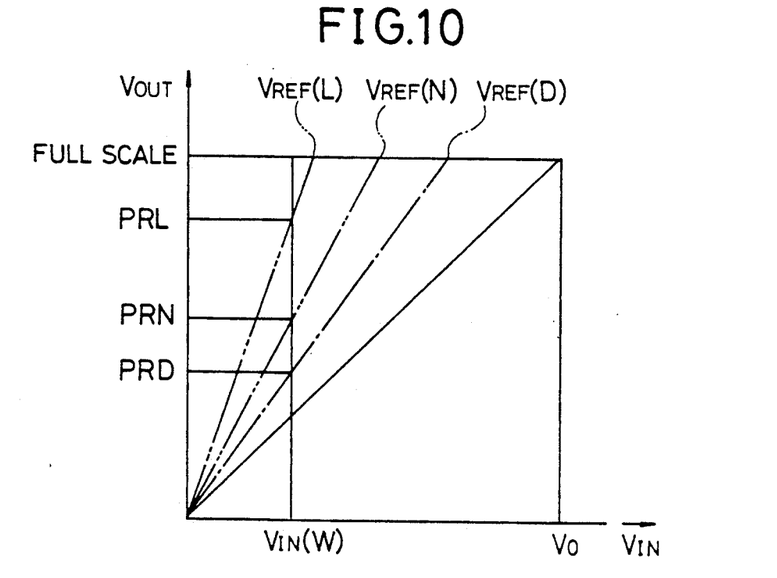
FIG.10 is a graph illustrating reference voltages used in the embodiment of FIG.7.

Referring to FIG.10, at the commencement of the above-mentioned operation, the count value of the down counter 46 corresponds to a characteristic line of the solid line. Then as the down counter 46 counts down, the slope of the characteristic line increases. Then the down counter 46 stops counting when the characteristic line becomes identical to the light mode characteristic line $V_{REF}(L)$. Similar operation is done in the normal mode or dark mode.

The above-mentioned process is further described with reference to FIG.12. In FIG.12, ADmax is the possible maximum output of the A/D converter 40, which corresponds to the full scale (255 (=11111111=$FF_H$), for example). The output data limiting value PRL is set equal to 120. Although the output data limiting value PRL is set equal to 120 for convenience' sake, in practice, PRL=255, PRN=253, and PRD=239, for example. $V_{REF}$max is the reference voltage for the A/D converter 40, and corresponds to the maximum value of the output DCout of the down counter 46 (=(initial value)=255). A reference voltage $V_{REF}(L)$ is a voltage which is related to the light mode and obtained when PRL=$V_{IN}(W)$ as indicated by the solid line. The reference voltage signal to be supplied to the A/D converter 40 varies toward the solid line indicative of the light mode from the state of the broken line, as down counting proceeds. In this manner, the reference voltage $V_{REF}$ for the A/D converter 40 is determined.

Figure 13:
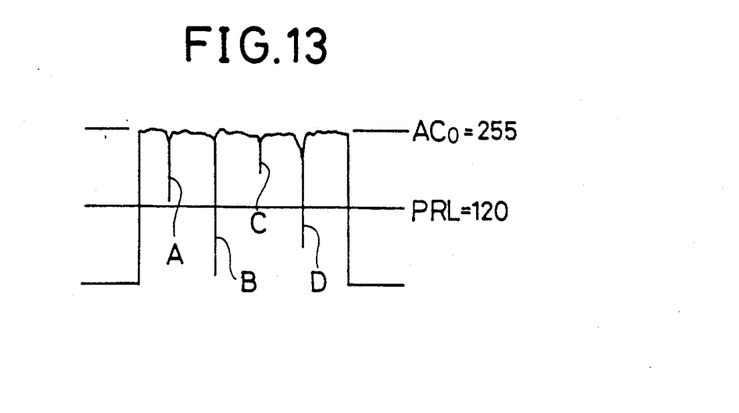
FIG.13 is a view illustrating a waveform of a signal to be processed in the embodiment.

FIG.13 illustrates an actual signal waveform output from the A/D converter 40. The illustrated output signal of the A/D converter 40 includes four image data A, B, C, and D in one line. Since the output data limiting value PRL to be set in the light mode is 120 (the full scale is 255), data in a range of 120 to 255 are considered white, and data of the remaining levels are determined to be actual image data. In the example of FIG.13, image data A and C are determined to be white, and image data B and D are determined to be effective image data having respective gradation levels.

According to the reference voltage determination process of the embodiment, it is enough to set the maximum initial value $V_{REF}$max to be initially set so as to be larger than the reference voltage $V_{REF}(D)$ to be set in the dark mode. This will be seen from FIGS.10 and 12. By taking into consideration the above-mentioned setting, the reference voltage setting is possible only by generally approaching the maximum initial value $V_{REF}$max to the reference value $V_{REF}(D)$ for the dark mode, for example. As a result, no manual adjustment is required. The digital process of the embodiment is hard to be affected by the presence of noise, compared with the conventional sample and hold process. Therefore, the stability of system is excellent.

Figure 14A:
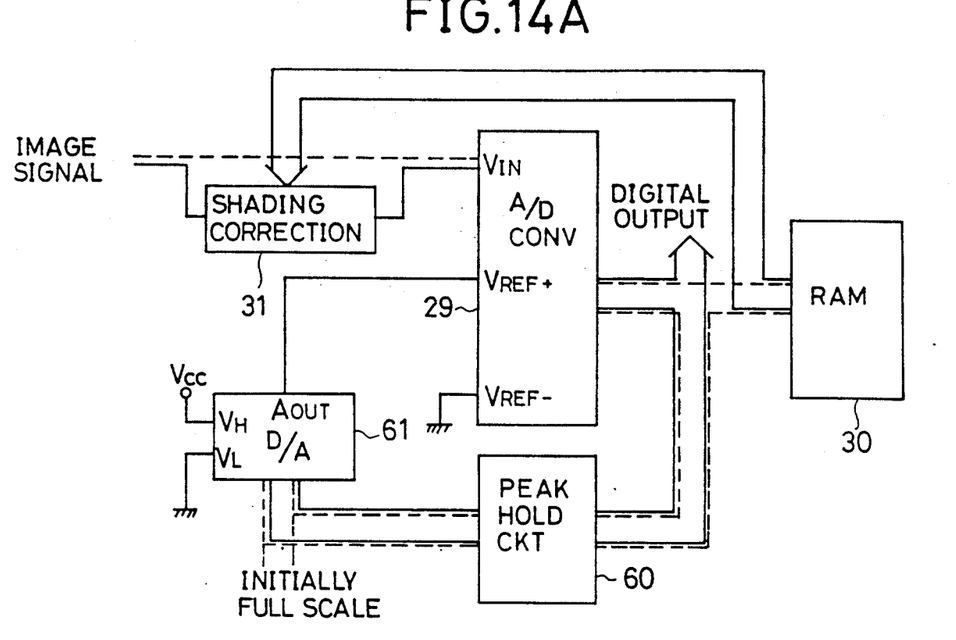
FIGS.14A and 14B are views illustrating a second preferred embodiment of the present invention.
Figure 14B:
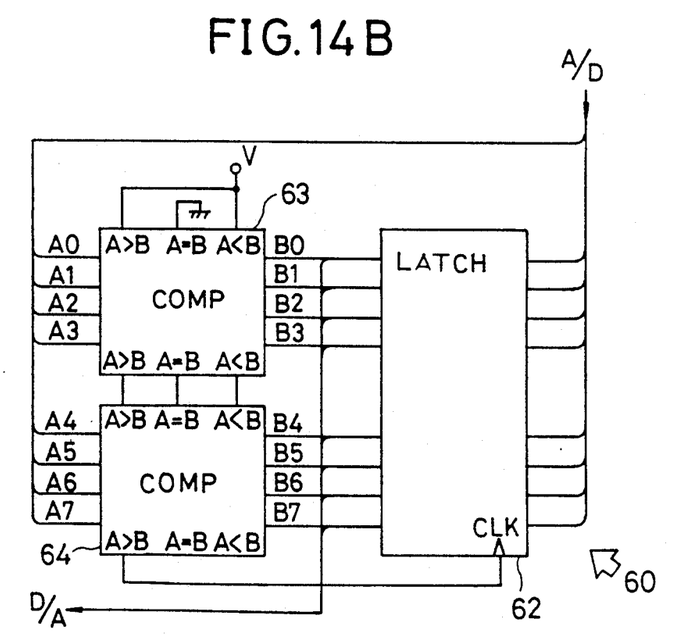

A description is given of a second preferred embodiment of the present invention with reference to FIGS.-14A and 14B. The second embodiment corresponds to an improvement of the first embodiment. In the above-mentioned first embodiment, the reference voltage which functions to determine the read density range is automatically set by changing the reference voltage $V_{REF}$ for the A/D converter 40. For this purpose, the reference voltage $V_{REF}$ is gradually increased until the digital output Vout becomes equal to a predetermined value. Therefore, there is a probability that the identical operation is repetitively carried out until the reference voltage $V_{REF+}$ becomes identical to the predetermined value, although depending on a value of the increasing step size.

The second embodiment intends to improve the above. FIG.14A shows an essential part of the second embodiment. In FIG.14A, those parts which are the same as those in FIG.6A are given the same reference numerals. As will be seen from comparison of FIGS.6A and FIG.14A, the second embodiment is constructed by adding to the structure of FIG.6A, a peak hold circuit 60 served as a maximum value detection circuit, and a digital-to-analog multiplier (hereafter simply referred to as a D/A converter) 61.

The D/A converter 61 is constituted by a D/A converter, which functions in the same way as the D/A converter 31 used for the shading correction. There is the following relationship between analog inputs $V_H$ and $V_L$ to be supplied to the D/A converter 61, digital input$\Sigma Di$, and analog output Aout:

$$Aout = (V_H - V_L)(\Sigma Di/FS)$$

When the resolution is set so as to amount to 8 bits, and the input terminals $V_L$ and $V_H$ are set to the ground potential and a power source voltage Vcc, respectively, the following formula is obtained:

$$Aout = Vcc(93\ Di/255)$$

An operation of the second embodiment is summerized as follows. At the commencement of shading data reading when the reading position is located on the white reference plate, and normal reading, the reference voltage $V_{REF+}$ for the A/D converter 29 is set equal to a voltage value. Then the maximum value contained in a digital data output amounting to one line is detected by the peak hold circuit 60. Then, the reference voltage terminal $V_{REF+}$ of the D/A converter 29 is set to a certain voltage. The maximum value of the digital output defined based on the above reference voltage, is detected by the peal hold circuit 60. Then the D/A converter 61 resets the reference voltage to be supplied to the terminal $V_{REF+}$ so as to make the value of the detected peak (maximum) identical to the full scale of the A/D conversion implemented by the A/D converter 29.

In detail, at the commencement of reading the shading data, the digital input to the D/A converter 61 is set to the full scale (amounting to 255). The terminal $V_{REF+}$ of the A/D converter 29 is supplied with a positive power source voltage Vcc as it is. The voltage Vcc is sufficiently higher than the analog image data $V_{IN}$. In this state, the white reference plate is read, and image data obtained is converted to corresponding digital data by the A/D converter 29. The peak hold circuit 60 holds the largest of the digital data amounting to one line.

An example of the structure for the peal hold circuit 60 is illustrated in FIG.14B. As is illustrated, the peak hold circuit 60 is made up of a latch circuit 62 of LS374, for example, and magnitude comparators 63 and 64 of LS85, for example. The comparators 63 and 64 compare the output of the latch circuit 62 and the digital output derived from the A/D converter 29 (FIG.14A), and rewrite the contents of the output data of the latch circuit 62 only when the digital output from the A/D converter 29 (FIG.14A) is larger than the latch output. In this manner, the latch circuit 62 always holds the maximum value up to the present. For the next line input, the digital input to the D/A converter 61 is supplied with the latched maximum value from the latch circuit 62.

When the maximum value is represented as Pi, a voltage of Vcc·$\Sigma$Pi/255 appear at the terminal Aout of the D/A converter 61. This voltage is concerned with the reference voltage $V_{REF+}$, and is also the maximum voltage of the line of concern. For example, if the maximum value is half the full scale, namely, 128, the reference voltage $V_{REF+}$ is reset equal to the Vcc/2, which is served as the maximum value of the analog image data $V_{IN}$. Accordingly, the second embodiment can present ideal relationship between $V_{IN}$ and $V_{REF}$ to be set at the time of shading correction, as illustrated in FIG.5A. In this state, the shading data is read, and stored in the RAM 30. The reset of the reference voltage $V_{REF+}(N)$ can be done in the same way as the above. That is, the white reference plate is read at the first one line, and the maximum value of the digital output is detected by the peak and hold circuit 60. Thereby, the second embodiment can present ideal relationship between $V_{IN}$ and $V_{REF}$ to be set at the time of normal image reading (after the shading correction), as illustrated in FIG.5B.

In the second embodiment, the upper limit of the digital output is defined by using the peak hold circuit 60. Additionally, it is possible to automatically adjust the lower limit of the digital output by providing a minimum value detection circuit which is coupled to the terminal $V_{REF-}$ of the A/D converter 29 and is designed to detect the lowest value of the digital output by use of a black reference plate.

According to the above-mentioned embodiments, the reference voltage for A/D converters can be automatically set. Even when the analog image signal $V_{IN}$ varies due to noise or the like, it is possible to automatically adjust the reference voltage so as to be placed in the possible range of the analog input voltage $V_{IN}$. As a result of the automatic adjustment, it becomes possible to effectively use gradation levels. Particularly, according to the second embodiment, it takes short to obtain the desired reference value.

The present invention is not limited to the aforementioned embodiments, and variations and modifications may be made without departing from the scope of the present invention.

What is claimed is:

1. An apparatus for converting an analog image signal to a digital image signal based on a reference voltage, comprising:

counter means, having a control terminal, for counting a first signal and outputting a counted value in digital form;

digital-to-analog (D/A) converting means, connected to said counter means, for converting said counted value to an analog voltage signal served as said reference voltage;

analog-to-digital (A/D) converting means, connected to said D/A converter means, for converting said analog image signal to said digital image signal based on said reference voltage generated by said D/A converting means; and comparing means, connected to said A/D converter means, for comparing in magnitude said digital image signal and a threshold level used for limiting the magnitude of said digital image signal, thereby outputting a control signal based on the results of comparison.

said counter means continuing to count said first signal until said control signal derived from said comparing means is supplied to said control terminal of said counter means, wherein said comparing means comprises a plurality of comparators, each of which is supplied with corresponding threshold levels each used for limiting the magnitude of said digital image signal, and selection means for selecting one of the plurality of comparators and coupling the selected one of said comparators to said control terminal of said counter means.

2. An apparatus as claimed in claim 1, wherein said counter means comprises a down counter having a predetermined preset value and said control terminal, and said down counter counts down from said predetermined preset value with said first signal until said control signal is supplied to said control terminal.

3. An apparatus as claimed in claim 2, wherein said control terminal of said down counter is an enable terminal.

4. An apparatus as claimed in claim 1, wherein said first signal is a line synchronizing signal supplied from an external circuit each time said analog image signal amounting to one line is supplied to said A/D converter means.

5. An apparatus as claimed in claim 1, wherein said selector means selects one of the plurality of comparators, depending on a desired density of an image formed by said digital image signal.

6. An apparatus as claimed in claim 1, wherein when said counter means counts said first signal in a state where said analog input signal is a white signal supplied from an external system in which a white document is scanned.

7. An apparatus as claimed in claim 1, wherein said reference voltage generated by said D/A converter defines the full scale of said digital image signal.

8. An apparatus as claimed in claim 1, wherein said threshold level corresponds to a desired density of an image formed by said digital image signal.

9. An apparatus as claimed in claim 1, wherein said digital image signal is represented as the following formula, $$Vout = (V_{IN}/V_{REF}) \cdot FS$$

where $V_{IN}$ is said input analog signal supplied to said A/D converting means, $V_{REF}$ is said reference voltage supplied from said D/A converting means, and FS is the full scale of said digital output means.

10. An apparatus as claimed in claim 1, wherein said A/D converting means comprises an A/D converter having an input terminal to be supplied with said analog image signal, an output terminal through which said digital image signal is output, a first reference terminal for setting an upper-limit voltage which is a base on A/D conversion, and a second reference terminal for setting a lower-limit voltage which is a based on A/D conversion, and wherein said reference voltage supplied from said D/A converting means is supplied to said first reference terminal, and a predetermined voltage lower than said reference voltage is supplied to said second reference terminal.

11. An apparatus as claimed in claim 10, wherein said logic gate means comprises an AND gate and an inverter, and said predetermined time is a time prior to a time when said analog image signal represents real image data which follows a reference while signal.

12. An apparatus as claimed in claim 1, wherein said comparing means comprises a comparator for comparing said digital image signal supplied from said A/D converter and said threshold level, thereby generating said control signal, latch means for latching said control signal generated by said comparator, and logic gate means for passing said control signal during only a predetermined time and supplying the same to said counter means.

13. An apparatus as claimed in claim 12, wherein said latch means is reset and cleared each time when said analog image signal including image data amounting to a sheet of document is applied to said A/D converting means.

14. An apparatus as claimed in claim 1, wherein said analog image signal is a signal which has been subjected to a shading correction process.

* * * * *

UNITED STATES PATENT AND TRADEMARK OFFICE
CERTIFICATE OF CORRECTION

PATENT NO. : 5,027,117

DATED : June 25, 1991

INVENTOR(S) : Yoshiki Yoshida et al.

It is certified that error appears in the above-identified patent and that said Letters Patent is hereby corrected as shown below:

ON TITLE PAGE:
The title is incorrect, should be, --ANALOG TO DIGITAL IMAGE CONVERSION USING A VARIABLE REFERENCE BASED ON IMAGE DENSITY--.

Signed and Sealed this

Fifth Day of November, 1991

Attest:

HARRY F. MANBECK, JR.

*Attesting Officer*  *Commissioner of Patents and Trademarks*